(12) United States Patent
Kienzle et al.

(10) Patent No.: US 6,914,249 B2
(45) Date of Patent: Jul. 5, 2005

(54) PARTICLE-OPTICAL APPARATUS, ELECTRON MICROSCOPY SYSTEM AND ELECTRON LITHOGRAPHY SYSTEM

(75) Inventors: Oliver Kienzle, Aalen (DE); Rainer Knippelmeyer, Aalen (DE)

(73) Assignee: Carl Zeiss NTS GmbH, Oberkochen (DE)

( * ) Notice: Subject to any disclaimer, the term of this patent is extended or adjusted under 35 U.S.C. 154(b) by 0 days.

(21) Appl. No.: 10/639,592

(22) Filed: Aug. 13, 2003

(65) Prior Publication Data

US 2004/0105160 A1 Jun. 3, 2004

(30) Foreign Application Priority Data

Aug. 13, 2002 (DE) .......................................... 102 37 141
Aug. 14, 2002 (DE) .......................................... 102 37 297

(51) Int. Cl.[7] .......................... H01J 37/304; H01J 3/14; G01N 23/00; G21G 5/00
(52) U.S. Cl. ................... 250/396 R; 250/398; 250/310; 250/311; 250/492.2
(58) Field of Search ............................ 250/396 R, 398, 250/396 ML, 306, 307, 310, 311, 492.2; 355/67

(56) References Cited

U.S. PATENT DOCUMENTS

| 3,717,785 A | 2/1973 | Guernet |
| 4,785,176 A | 11/1988 | Frosien et al. |
| 4,994,336 A | 2/1991 | Benecke et al. |
| 6,288,401 B1 | 9/2001 | Chang et al. |
| 2001/0054690 A1 | 12/2001 | Shimada et al. |
| 2002/0054284 A1 | 5/2002 | de Jager et al. |
| 2003/0066961 A1 | 4/2003 | Kienzle et al. |
| 2004/0149925 A1 | 8/2004 | Muller |

FOREIGN PATENT DOCUMENTS

| DE | 2 102 608 A | 7/1971 |
| DE | 101 31 931 A1 | 1/2003 |
| DE | 101 36 190 A1 | 2/2003 |
| DE | 101 61 680 A1 | 6/2003 |
| EP | 1 182 684 A2 | 2/2002 |
| WO | WO 03/015121 A2 | 2/2003 |

OTHER PUBLICATIONS

English language translation of DE 101 61 680 A1 (published Jun. 26, 2003).

Primary Examiner—Scott J. Sugarman
Assistant Examiner—Jack Dinh
(74) Attorney, Agent, or Firm—Jones Day

(57) ABSTRACT

A particle-optical apparatus is provided for directing a beam of charged particles on an object plane or to image the object plane with the beam onto an image plane or intermediate image plane. The apparatus comprises a stack of lens assemblies which are disposed in beam direction at a fixed distances spaced apart from which other and are controllable for providing successively adjustable deflection fields for a beam traversing the stack. Each lens assembly provides at least one field source member for a magnetic or electric field. In particular, two rows of a plurality of field source members per lens assembly can be provided.

21 Claims, 14 Drawing Sheets

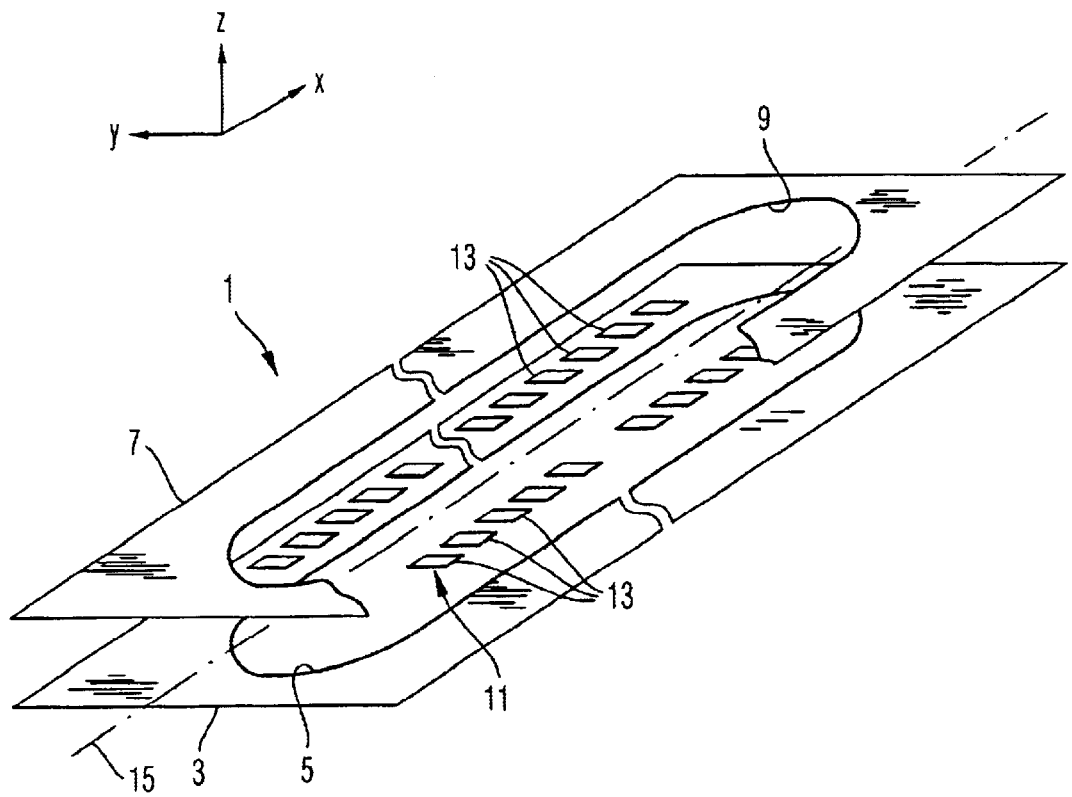
Fig. 1
Prior Art
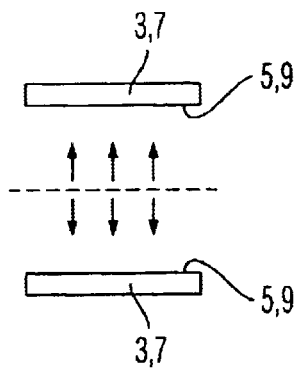 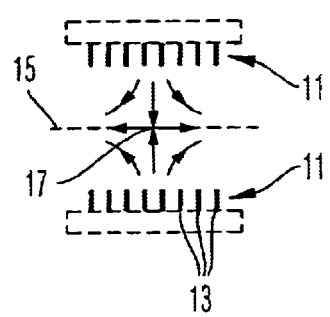 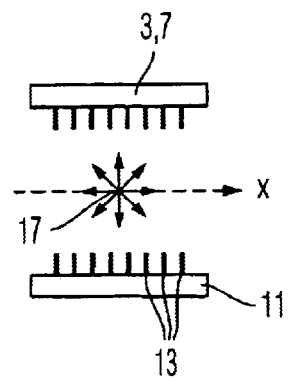
Fig. 2a  Fig. 2b  Fig. 2c
Prior Art

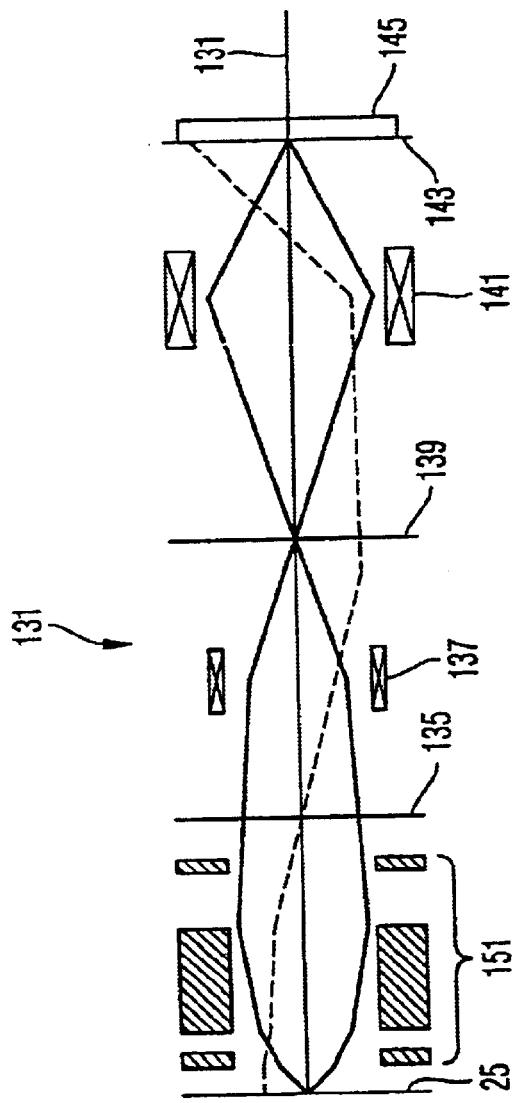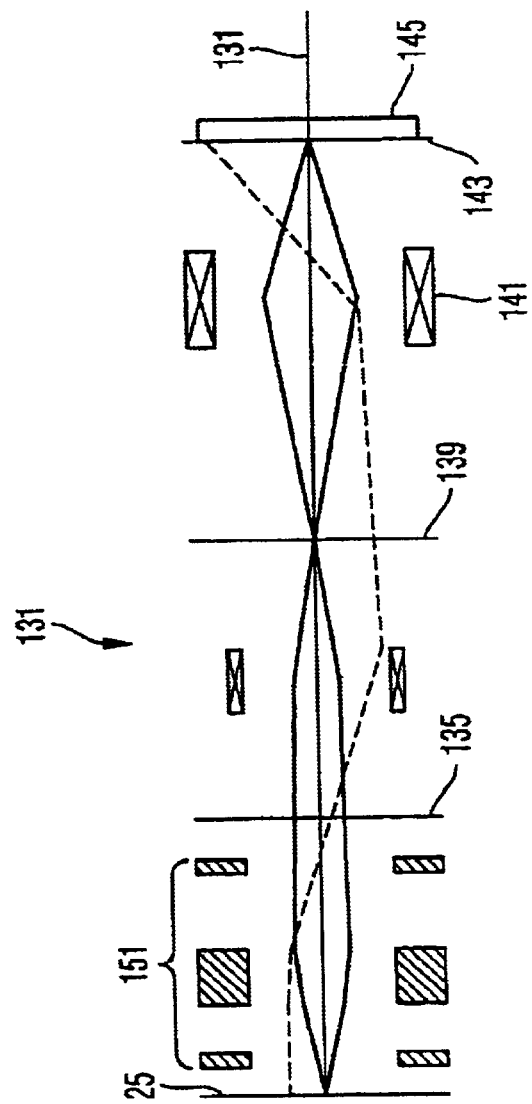

PARTICLE-OPTICAL APPARATUS, ELECTRON MICROSCOPY SYSTEM AND ELECTRON LITHOGRAPHY SYSTEM

This application is based upon DE 102 37 141.5 filed on Aug. 13, 2002, and DE 102 37 297.7 filed on Aug. 14, 2003, the entire contents of each of which are incorporated herein by reference.

BACKGROUND OF THE INVENTION

1. Field of the Invention

The invention relates to a particle-optical apparatus, an electron microscopy system and an electron lithography system.

2. Brief Description of Related Art

Particle-optical apparatuses operating with beams of charged particles are used, among others, in the manufacture of miniaturized devices, such as semiconductors, both for the manufacture itself and the examination of the structures which are manufactured. Examples of this are electron microscopy systems and electron lithography systems. However, the invention is not limited to these systems, but relates to particle-optical apparatuses in general which manipulate beams of charged particles of all kind, such as electrons and ions.

From the prior art there are known, for example, scanning electron microscopes (SEM) which make use of lenses for focusing an electron beam in an object plane. The lenses provide focusing electric fields, focusing magnetic fields or superpositions of focusing electric and focusing magnetic fields. In order to provide the fields for a charged-particle beam, the lens must comprise a physical assembly surrounding the beam and providing the corresponding field source members, such as electrodes or/and magnetic pole pieces. This imposes limitations on the configuration of the fields manipulating the beam. The limitations are due to limits in respect of the mechanical precision in the manufacture of the source members as well as in respect of the mechanically feasible geometries of the field source members.

Further, a particle-optical apparatus is known from the art which is referred to hereinafter as a "comb lens" and which is described in further detail hereinafter with reference to FIGS. 1 and 2a–2c.

The particle-optical apparatus 1 comprises three electrode arrangements superimposed in the z-direction, namely a slit electrode 3 at the bottom comprising an aperture 5 elongated in the x-direction, a slit electrode 7 at the top comprising an aperture 9 likewise elongated in the x-direction, as well as a comb electrode arrangement 11 disposed between the two slit electrodes 3 and 7. The comb electrode 11 comprises two rows of source members for electric fields, namely finger electrodes 13, which are disposed on both sides of a central longitudinal axis 15 of the comb electrode 11. The central axis extends in the x-direction. A space in the xy-plane between the two rows of finger electrodes 13 may be regarded as an aperture of the comb electrode 11.

Electric potentials are supplied to the two slit electrodes 3 and 7 as well as to the finger electrodes 13 by a controller, not shown in FIG. 1, so that adjustable electric fields can be generated between the electrodes 3, 7 and 13. These fields act on a beam of electrically charged particles which is oriented transversely to the xy-plane and traverses the apertures of the electrodes 7, 11 and 5. If an electric potential is applied to the slit electrodes 3 or 7 which is different from the potential of the beam of charged particles in the plane of the respective slit electrode 3, 7, the effect of the slit electrodes 3 and 7 respectively exerted on the beam is that of a cylinder lens. A configuration of the electric field lines as it is generated by such a slit electrode 3, 7 is schematically shown in FIG. 2a.

A potential pattern can be applied to the finger electrodes 13 of the comb electrode 11 such that a quadrupole-like electric field is generated in the aperture of the slit electrode 11. A configuration of field lines of such quadrupole field is schematically shown in FIG. 2b. The quadrupole field has an axis of symmetry 17 which extends in the z-direction and intersects the longitudinal axis 15 of the comb electrode 11.

A beam of electrically negatively charged particles entering such quadrupole field is focused in the x-direction and defocused in the y-direction.

Thus, when a beam enters the apparatus 1 along the axis of symmetry 17 of the quadrupole field, it is subjected as a whole to the effects of the cylinder lens fields provided by the slit electrodes 3 and 7 according to FIG. 2a as well as of the quadrupole field provided by the comb electrode 11 according to FIG. 2b. The beam is thus subjected to a superposition of the field configurations shown in FIGS. 2a and 2b. When the strengths of the cylinder lens fields and the quadrupole field are appropriately adjusted to each other, the effect exerted on the beam is the same as that produced by a round lens field, the field lines of which are schematically shown in FIG. 2c.

It is thus possible to focus a beam of charged particles by means of the apparatus 1 if appropriate voltages are applied to the electrodes 3, 7 and 13. Further, the beam may be scanned to any position along the longitudinal axis 15 of the comb lens, and it is possible to energize the comb electrode such that the axis of symmetry of the quadrupole field coincides with the beam. The beam will then experience the focusing effect of the comb lens irrespective of its position along the longitudinal axis.

As the quadrupole field to be formed for generating the round lens effect is generated in this apparatus by a limited number of discrete finger electrodes, the generated field will deviate from an ideal quadrupole field as a result of a discretization error. This constitutes a limitation for the comb lens in practical use. Moreover, such comb lens can only be manufactured with sufficient precision with a very high expenditure in mechanics.

SUMMARY OF THE INVENTION

Accordingly, it is an object of the present invention to provide a particle-optical apparatus for manipulating a beam of charged particles, which apparatus offers increased degrees of freedom in the configuration of corresponding beam-manipulating fields.

To this end, the invention provides a particle-optical apparatus which comprises a stack of lens assemblies which are disposed at fixed distances from each other in a direction of a beam traversing the apparatus and which are controllable for providing successively adjustable beam-manipulating fields for the beam traversing the stack. Each of the lens assemblies comprises a plate which is oriented transversely to the direction of the beam and comprises an aperture for the beam to pass through, and at least one field source member for providing a beam-manipulating field to act on the beam.

Due to the plurality of lens assemblies which include, in particular, more than three, preferably, more than four, further preferred, more than five and, even more preferred, more than six or seven and, in particular, more than ten lens assemblies, it is possible to provide a great number of degrees of freedom along a beam axis to manipulate the beam and to "synthesize", so-to-speak, a beam-shaping total field. With such a lens stack, it is, in particular, also possible to change the optical properties of the apparatus time-dependently and, in particular, to switch over between two or more operating modes of the apparatus. Moreover, it is also possible, due to the great number of degrees of freedom, to compensate for manufacturing errors which can occur in each individual assembly. It is also possible, due to geometric limitations or limitations in terms of manufacturing engineering to compensate for imperfect field configurations in one assembly by correspondingly controlling another assembly.

According to an embodiment of the present invention, the particle-optical apparatus comprises a stack of plural lens assemblies, wherein the lens assemblies are disposed spaced apart from each other in a direction of the beam traversing the stack, wherein each lens assembly comprises at least one row of field source members for generating at least one of an electric field and a magnetic field for manipulating the beam, wherein the rows extend in a second direction transversely oriented with respect to the first direction, and wherein the apparatus further comprises a controller adapted for applying a selectable excitation pattern to the at least one row of field source members of each lens assembly, wherein different excitation patterns may be applied to different lens assemblies.

The lens assembly can comprise two rows of field source members wherein the beam traverses the lens assembly through an aperture or space provided between the two rows of field source members.

According to an embodiment of the present invention, the field source members of one row project from a common plate, and according to a further preferred embodiment the lens assembly is manufactured by a lithographic process.

According to embodiments of the present invention, the lens assemblies of the stack are spaced apart in the beam direction by less than 5 mm, in particular less then 2 mm, and in particular less than 0.75 mm or 0.4 mm.

According to a further aspect, the invention provides a method for operating a particle-optical apparatus having a stack of at least four lens assemblies which are spaced apart in a direction of the beam path and further having at least one focusing lens. The method comprises exciting the at least one focusing lens and exciting the at least four field source members of the stack such that a first optical plane is imaged by the beam into a second optical plane which is optically conjugated to the first optical plane. For example, the first optical plane may be an object plane of the particle-optical apparatus and the second optical plane may be an image plane conjugated to the object plane such that the object plane is imaged by the beam onto the image plane.

The method further comprises changing of the excitation of the at least one focusing lens. Such change in excitation of the at least one focusing lens may be useful for changing optical properties of the apparatus, such as changing a magnification, changing a working distance, or changing an electrical field for accelerating or decelerating particles in a space between an object and an objective lens of the apparatus.

For compensating changes of optical properties involved with changing the excitation of the at least one focusing lens, the method further comprises changing the excitation of the at least four lens assemblies such that positions of the first and second optical planes along the beam path are maintained substantially constant when changing the excitation of the at least one focusing lens.

The stack of lens assemblies offers sufficient degrees of freedom for compensating changes induced in optical properties of the apparatus by changing the excitation of the at least one focusing lens.

The changing of the excitation of the at least four lens assemblies may in particular include a displacement of an excitation pattern along the beam direction and may be applied to the stack of lens assemblies. Such displacement will displace a location of the lens function in the direction of the beam and correspond to a corresponding mechanical displacement in this direction of a conventional lens.

As a result of such displacement a lens assembly of the stack having a highest excitation among all assemblies after such displacement will be different from that lens assembly which had the highest excitation before the displacement.

The excitation patterns applied to the lens assemblies may be complicated patterns, and according to an embodiment of the present invention a controller for exciting the lens assemblies comprises a memory for storing predefined excitation patterns which are applied to the assemblies of the stack based on the excitation of the at least one focusing lens.

The particle-optical apparatus can be used in an electron microscopy system or/and in an electron lithography system.

BRIEF DESCRIPTION OF THE DRAWINGS

The forgoing as well as other advantageous features of the invention will be more apparent from the following detailed description of exemplary embodiments of the invention with reference to the accompanying drawings, wherein:

FIG. 1 shows a conventional particle-optical apparatus;

FIGS. 2a–2c are representations of field configurations for illustrating a function of an apparatus according to FIG. 1;

FIG. 14 illustrates an electron microscopy system having a particle-optical apparatus in the first mode of operation, according to FIG. 13 as an objective lens;

FIG. 16 illustrates the electron microscopy system of FIG. 14 in the second mode of operation of the apparatus according to FIG. 15;

DETAILED DESCRIPTION OF THE EXEMPLARY EMBODIMENTS

Figure 3:
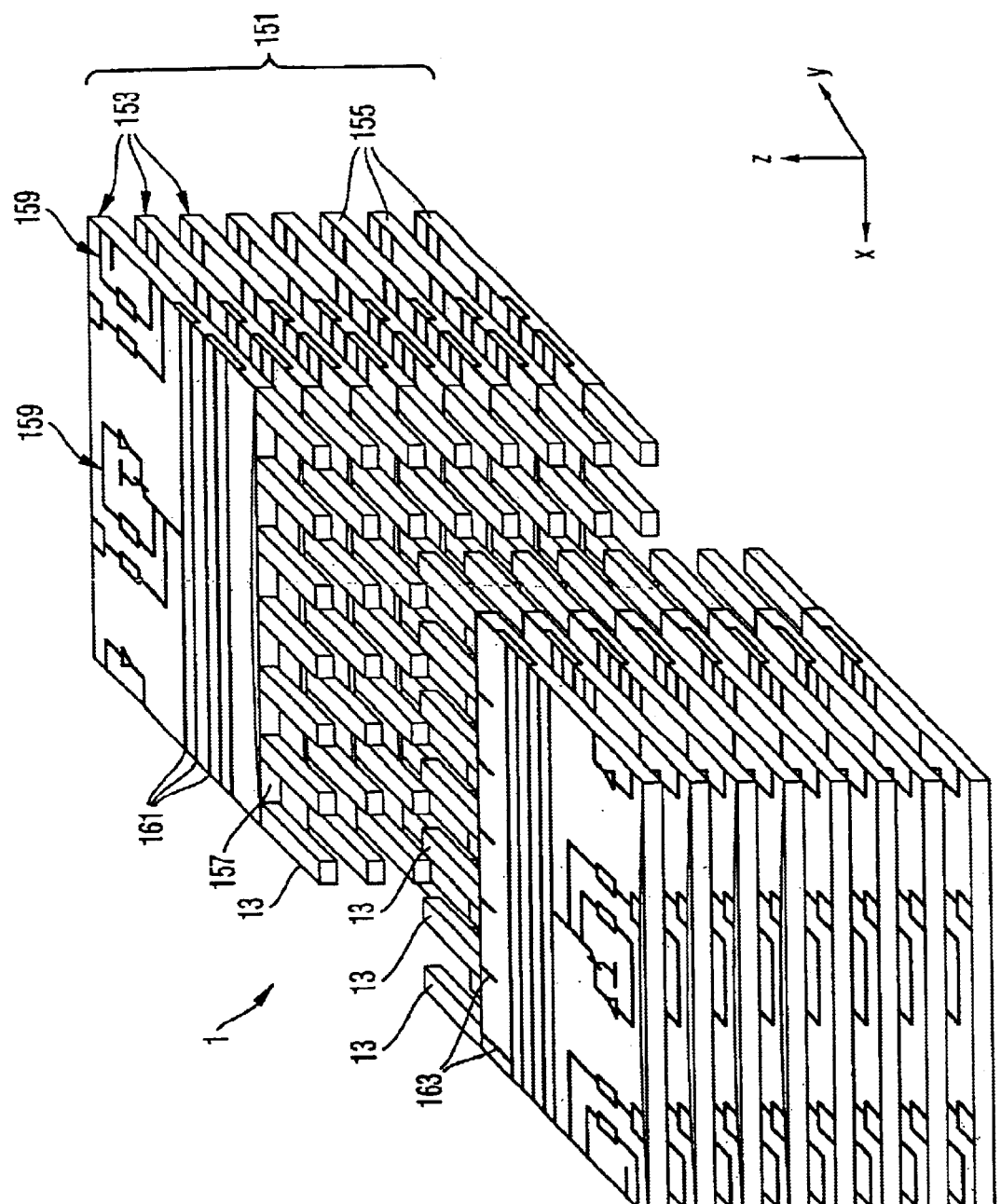
FIG. 3 is a perspective partial representation of a particle-optical apparatus having a stack of comb electrode assemblies, according to an embodiment of the invention.

FIG. 3 shows a particle-optical apparatus 1 according to the invention in perspective, partly cut-open view. The apparatus 1 comprises a stack 151 of a plurality of lens assemblies 153 which are disposed spaced apart from each other in the z-direction. Each lens assembly comprises of a plate 155 which delimits an aperture 157 which is elongated in the x-direction. Finger electrodes 13 project into the aperture 157 in the y-direction. The finger electrodes 13 are disposed in a row in the x-direction, spaced apart and insulated from each other. One row of finger electrodes 13 is provided on each side of the aperture 157. Each finger electrode of the one row is disposed opposite in the y-direction to a corresponding finger electrode of the other row. It should be noted that references to x-direction, y-direction, z-direction, etc., herein are merely for convenience and should not be considered as limiting the scope of the invention in any way.

Moreover, the plate 155 carries a plurality of driver circuits 159 which are schematically shown in FIG. 3 as a stabilized current source. The driver circuits 159 provide the voltages which are applied to the finger electrodes 13. To this end, a plurality of collecting lines 161 extending in the x-direction are provided, each of which is electrically connected to a circuit 159. Each of the finger electrodes 13 is connected via a single connecting line 163 to one of the collecting lines 161, with finger electrodes 13 disposed adjacent to each other in a row direction being sequentially and periodically connected to a respective other one of the collecting lines 161.

An exemplary manufacturing process that can be used to make the lens assembly 153 is illustrated hereinafter with reference to FIGS. 4a–4j. The manufacturing process starts with a semiconductor substrate 165 having a (110) surface which forms the supporting structure or plate 155 of the lens assembly 153 (FIG. 4a). A silicon oxide layer 167, 168 is deposited on each side of the substrate 165 (FIG. 4b). A chromium/gold layer 169 is then applied on the silicon oxide layer 167 (FIG. 4c). A photosensitive resist 171 is applied on the chromium/gold layer 169, and a photosensitive resist 172 is applied on the silicon oxide layer 168 (FIG. 4d). In a lithographic step, the resist 171 is exposed with a pattern which corresponds to patterns of the single connecting lines 163, the collecting lines 161 and the driver circuits 159. This may involve further lithographic steps, not separately shown in FIGS. 4a–4j, which may be applied together with further etching steps, likewise not shown, and the lithographic steps for producing the more complicated structures of the collecting lines 161 and driver circuits 159.

The photosensitive resist 172 is exposed with a pattern (FIG. 4d) which corresponds to the aperture 157.

FIG. 4e shows, by way of example, the deposition of a single connecting line 163. The photosensitive resist layers 171 and 172 are removed (FIG. 4f), and the side with the silicon oxide layer 169 is coated with a further photosensitive resist layer 175 which is exposed with a pattern corresponding to the finger electrodes (FIG. 4g). The photosensitive resist 175 is removed from the exposed regions, and the standing recesses are filled in order to form the finger electrodes 13. The photosensitive resist layer 175 is then removed (FIG. 4i). Subsequently, the aperture 157 is formed in the plate 155 from the side of the layer 168 by etching (FIG. 4j).

Figure 4:
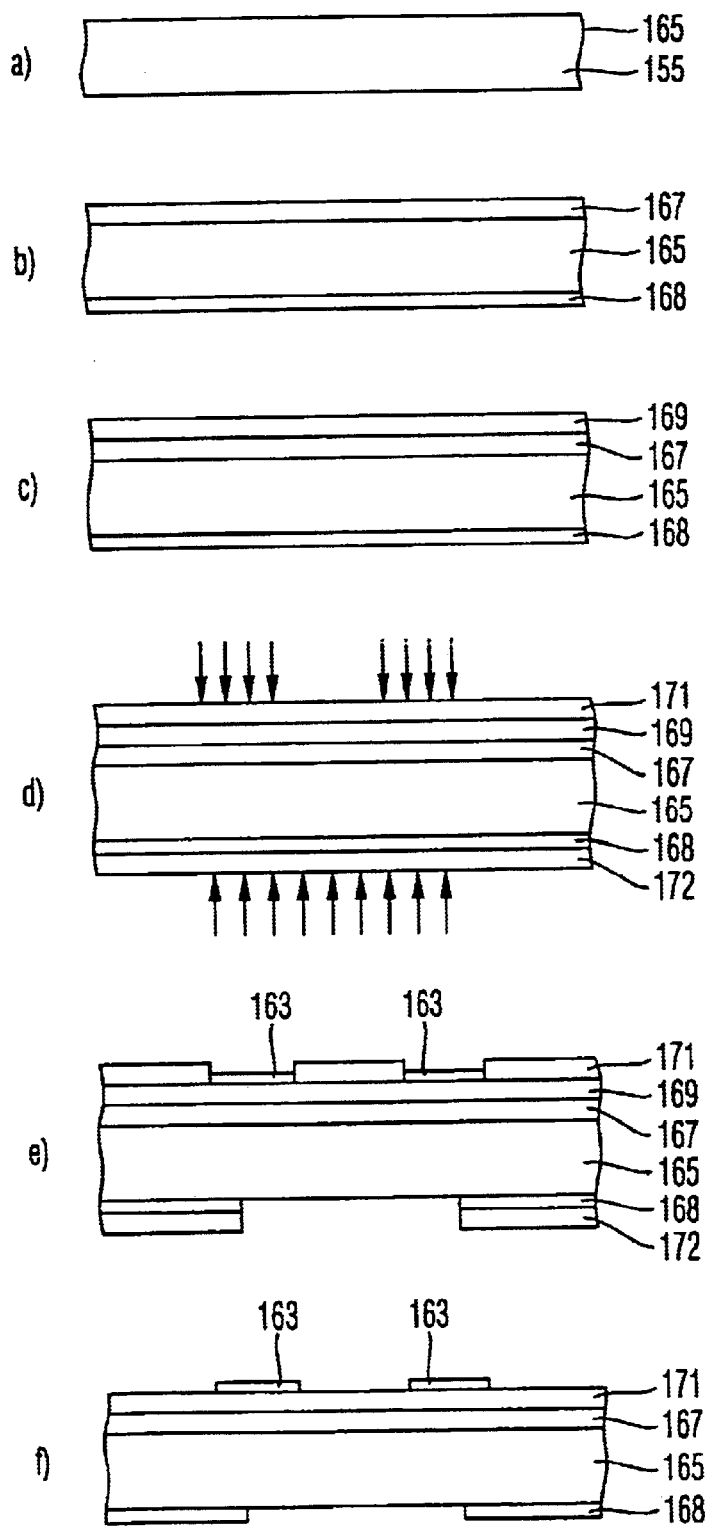
FIGS. 4a–4j illustrate a manufacturing process for the apparatus shown in FIG. 3.
Figure 4:
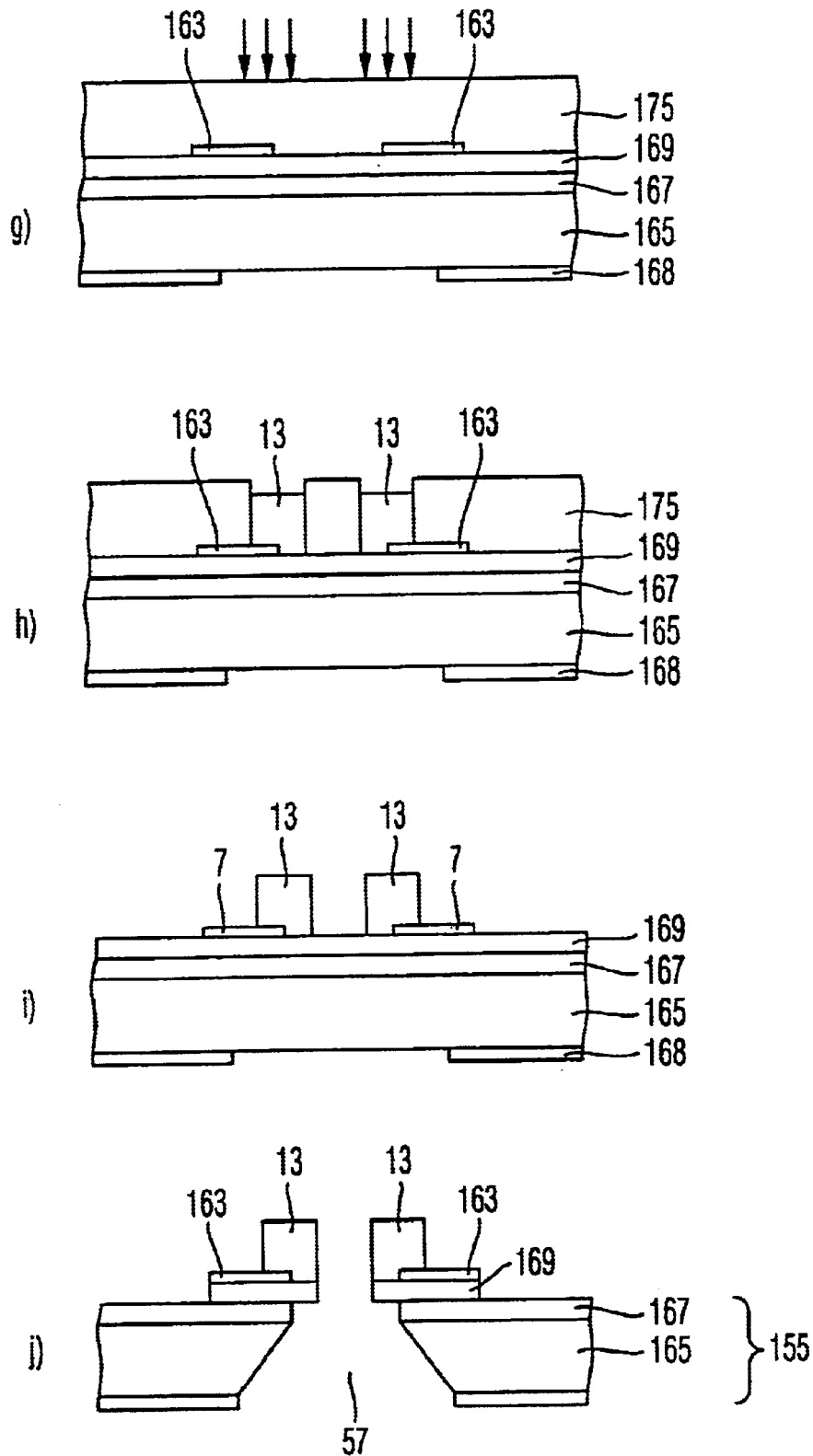
Figure 5:
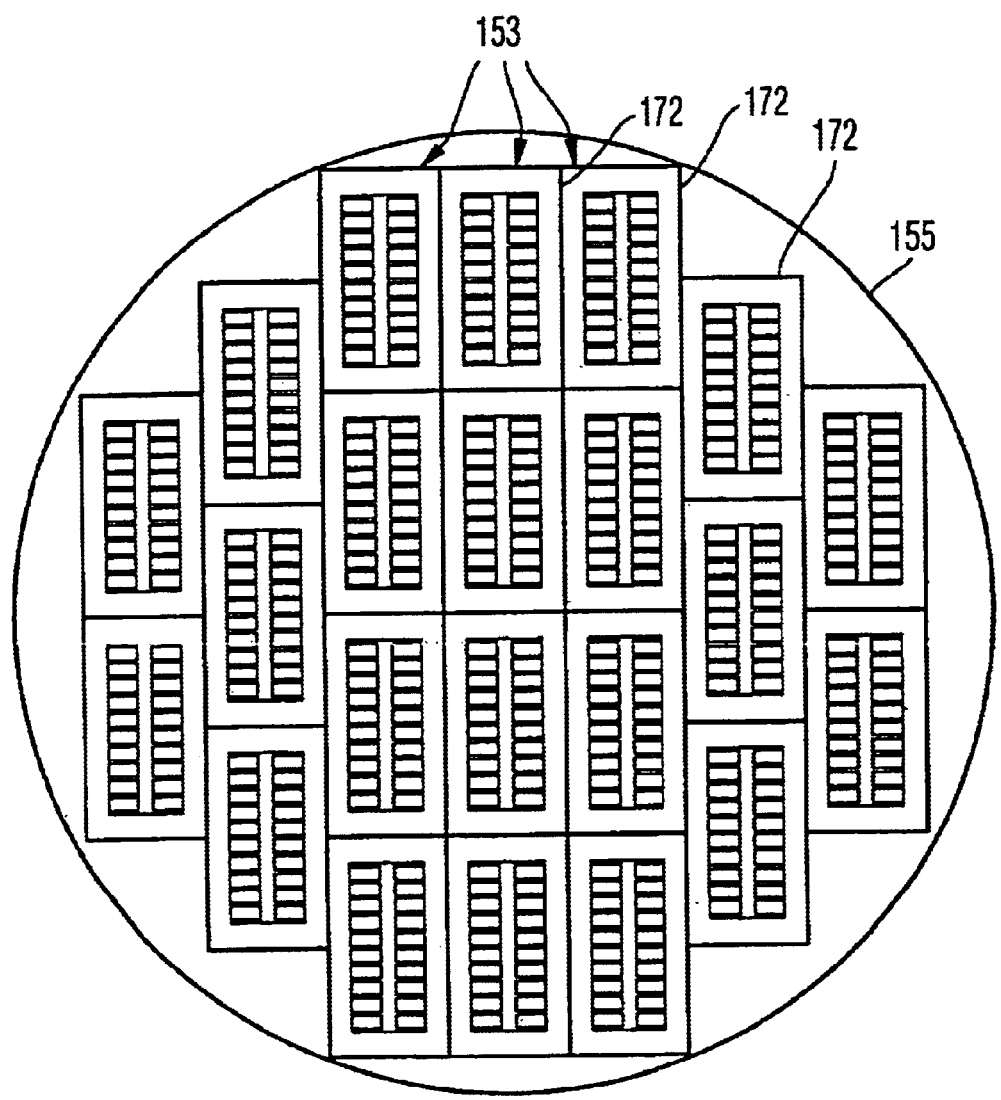
FIG. 5 is a view of plural comb electrode assemblies during the manufacturing process illustrated with reference to FIGS. 4a–4j.

The steps illustrated with reference to FIG. 4 are performed simultaneously on a single substrate or silicon wafer 155 to form a plurality of lens assemblies 153, as is evident from FIG. 5. This figure shows a plurality of lens assemblies on the wafer 155 which are subsequently separated from each other by sawing along lines 172. The separated assemblies 153 are then disposed on top of each other to form the stack 151, to which end suitable spacers are inserted between the plates 155.

Figure 6:
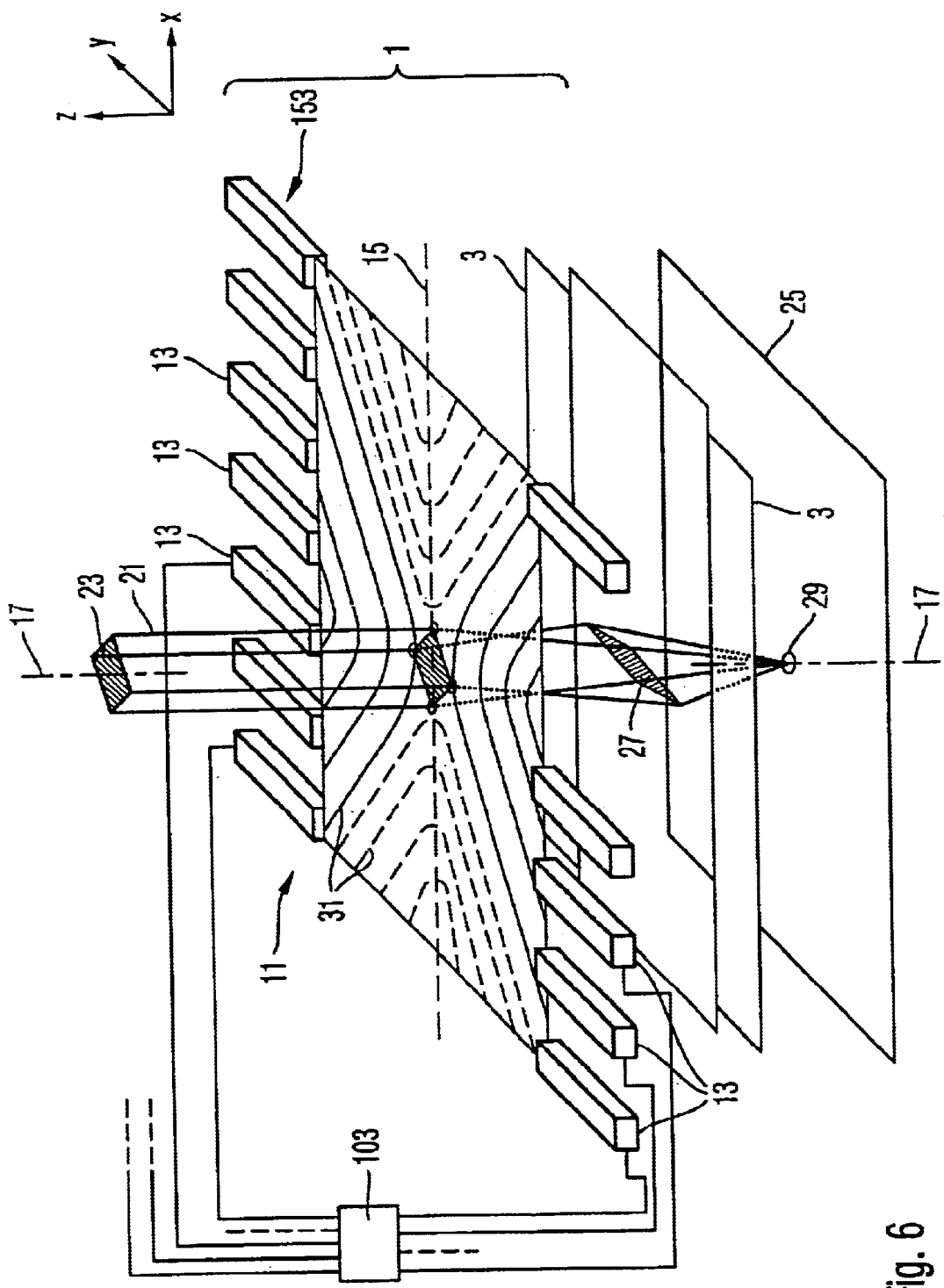
FIG. 6 is an illustration of a function of the apparatus shown in FIG. 3 on a charged-particle beam.

FIG. 6 schematically shows an exemplary manipulation of a beam of charged particles traversing the stack of lens assemblies 153 in spatial view, wherein only one representative lens assembly is shown in FIG. 6.

A beam 21 of charged particles with a rectangular cross-section 23 enters a particle-optical apparatus 1 in the z-direction along an axis of symmetry 17. The particle-optical apparatus comprises a comb electrode assembly 153 with two rows of finger electrodes 13 and a slit electrode 15 disposed therebelow. Below the slit electrode 15, an object plane 25 is disposed in which the beam 21 is to be focused.

A controller 103 applies a potential pattern to the finger electrode 13 such that an electric quadrupole field is generated in the aperture between the rows of finger electrodes 13. The configuration of the quadrupole field is illustrated in FIG. 6 by electric potential lines 31. The quadrupole field focuses the beam 21 in the x-direction and defocuses the same in the y-direction. Accordingly, after having passed through the comb aperture 11, the beam has in the plane of the slit electrode 3 a cross-sectional shape of a rhombus 27 elongated in the y-direction. The slit electrode 15, however, has an effect of a cylinder lens on the beam 21 which focuses the beam 21 in the y-direction so that it is focused in a small spot 29 in the object plane 25.

In FIG. 1, two slit electrodes 3 and 7 are respectively provided for generating the cylinder lens field, whereas merely one slit electrode 3 is provided for generating the cylinder lens field in FIG. 6. It is also possible to generate the cylinder lens field in the stack as shown in FIG. 3 by one of the comb electrode assemblies 153 by setting an average potential thereof to a value which differs from the potential of the beam 21 in the plane of this electrode assembly. Accordingly, on the average, the finger electrodes 13 of the further lens assembly provide the cylinder lens field and the respective quadrupole field is generated by position-dependent changes in the potentials of the finger electrodes 13 of the same lens assembly 153 or a further lens assembly located above or below that lens assembly.

Figure 7:
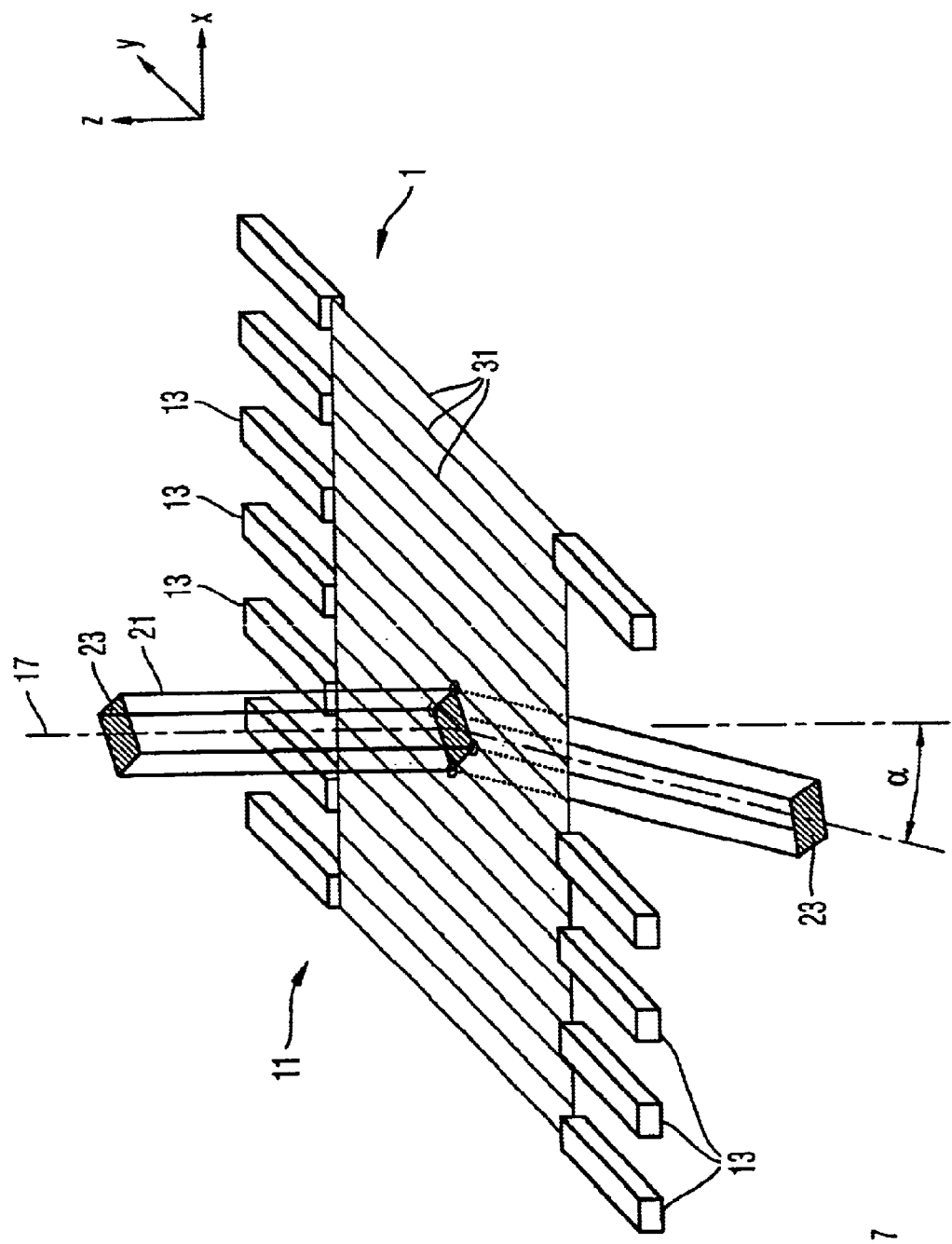
FIG. 7 is a further illustration of a function of the apparatus shown in FIG. 3 on a charged-particle beam.

FIG. 7 shows an exemplary operating mode of the lens assembly 153 which differs from the operating mode shown in FIG. 6 for focusing a beam of charged particles. In FIG. 7, potentials are applied to the finger electrodes 13 by a controller, not shown in FIG. 7, such that a substantially homogenous electric field oriented in the x-direction is generated in the aperture between the two rows of finger electrodes 13. Potential lines 31 of such electric fields are schematically indicated in FIG. 7. A beam 21 of charged particles of rectangular cross-section 23 entering the comb electrode assembly 11 along the beam axis 17 oriented in the z-direction is deflected in the x-direction by an angle α by the substantially homogeneous electric field formed in the aperture between the two rows of finger electrodes 13. The cross-section 23 of the beam will remain substantially unchanged.

As a result, it is possible to use the comb electrode assembly 11 as a beam deflector. In particular, the field deflecting the beam 21 can be provided only locally in a region traversed by the beam 21. Electrodes 13, i.e., the electric field need not extend over the entire length of the comb electrode assembly 11 in the x-direction.

Moreover, it is possible to combine the operating modes of FIGS. 6 and 7 in that potentials are applied to the finger electrodes 13 such that a superposition of the quadrupole field according to FIG. 6 and the homogeneous field according to FIG. 7 is generated in the aperture between the rows of electrodes. A suitably controlled comb lens assembly then has an effect of a focusing beam deflector.

Figure 8:
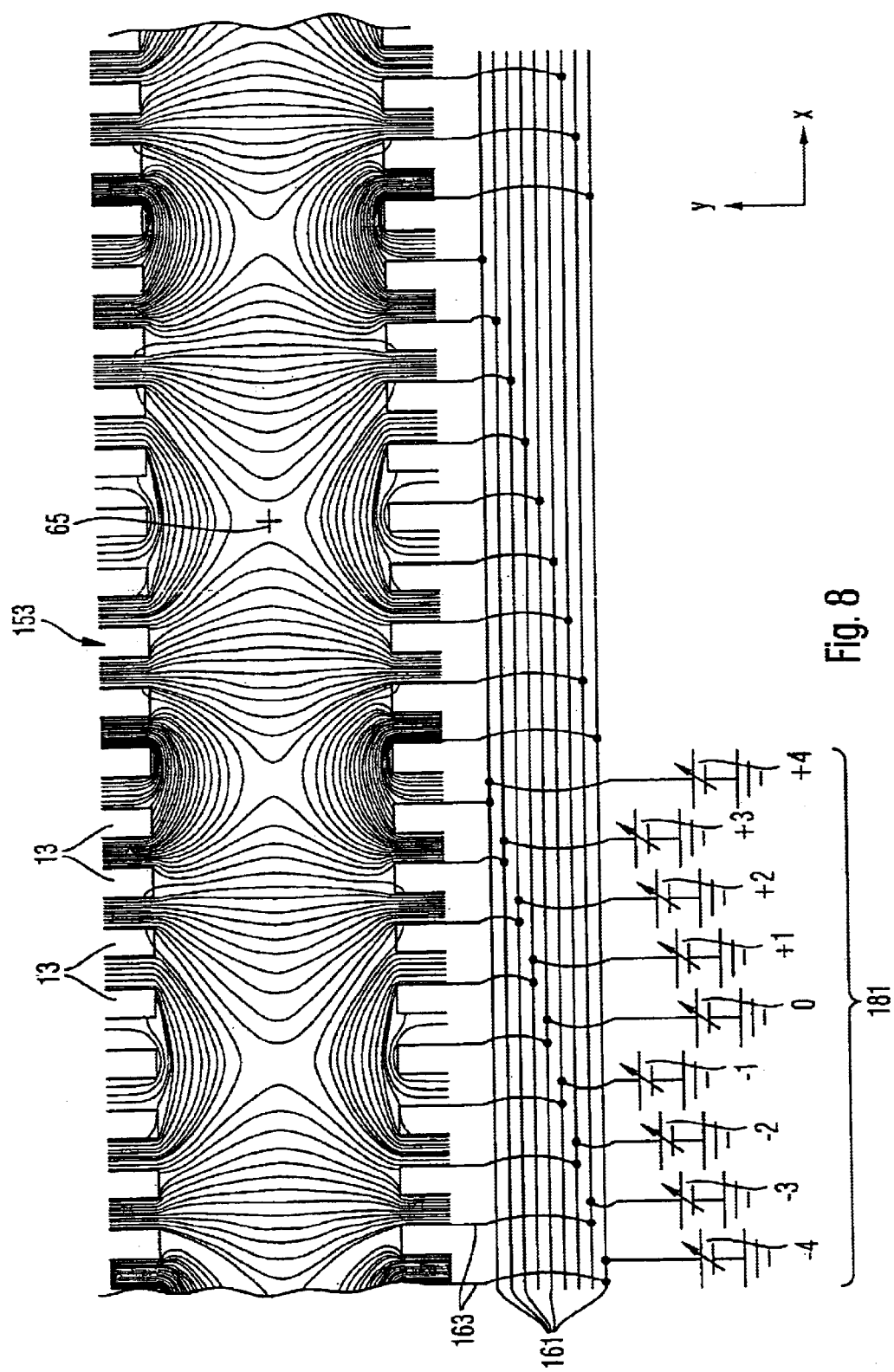
FIG. 8 is an illustration of a driver circuit for controlling a comb electrode assembly of the apparatus shown in FIG. 3.

FIG. 8 schematically shows an exemplary driver arrangement 181 for controlling the finger electrodes 13 of the assembly 153. The electrodes of the assembly 153 are controlled by the driver arrangement 181 such that a quadrupole-like field is generated in a region about the beam axis 17. As explained above, the beam axis 17 is displaceable in the x-direction and, accordingly, the voltage pattern applied to the electrodes 13 must likewise be displaced in the x-direction.

In the example of FIG. 8, the driver arrangement 81 comprises nine drivers 159 or voltage sources which are designated by '−4', '−3', '−2', '−1', '0', '+1', '+2', '+3', '+4'. The voltage sources may be individually controlled. Each voltage source is connected to plural electrodes 13. However, each electrode 13 is connected to only one single voltage source. To this end, nine collecting lines 161 extend in the direction of the rows, i.e., in the x-direction. Each collecting line 161 is connected to one single voltage source. The electrodes 13 are then sequentially and periodically electrically connected to a respective other one of the collecting lines 161.

FIG. 8 shows the respective driver arrangement 181 for merely one row of finger electrodes 13. However, a corresponding driver arrangement with connecting lines is also provided for the other row of finger electrodes.

The number of driver circuits 159 can be changed from lens assembly to lens assembly in order to be able to provide different field patterns by the different lens assemblies. In particular, each finger electrode 13 of the lens assembly 153 may comprise a separate driver 159 allocated thereto, or electrodes disposed approximately opposite to each other may be electrically connected with each other.

In the above-described figures, the finger electrodes 13 have a function of source members for the electric field provided by the lens assemblies 153 for manipulating the particle beam.

Figure 9:
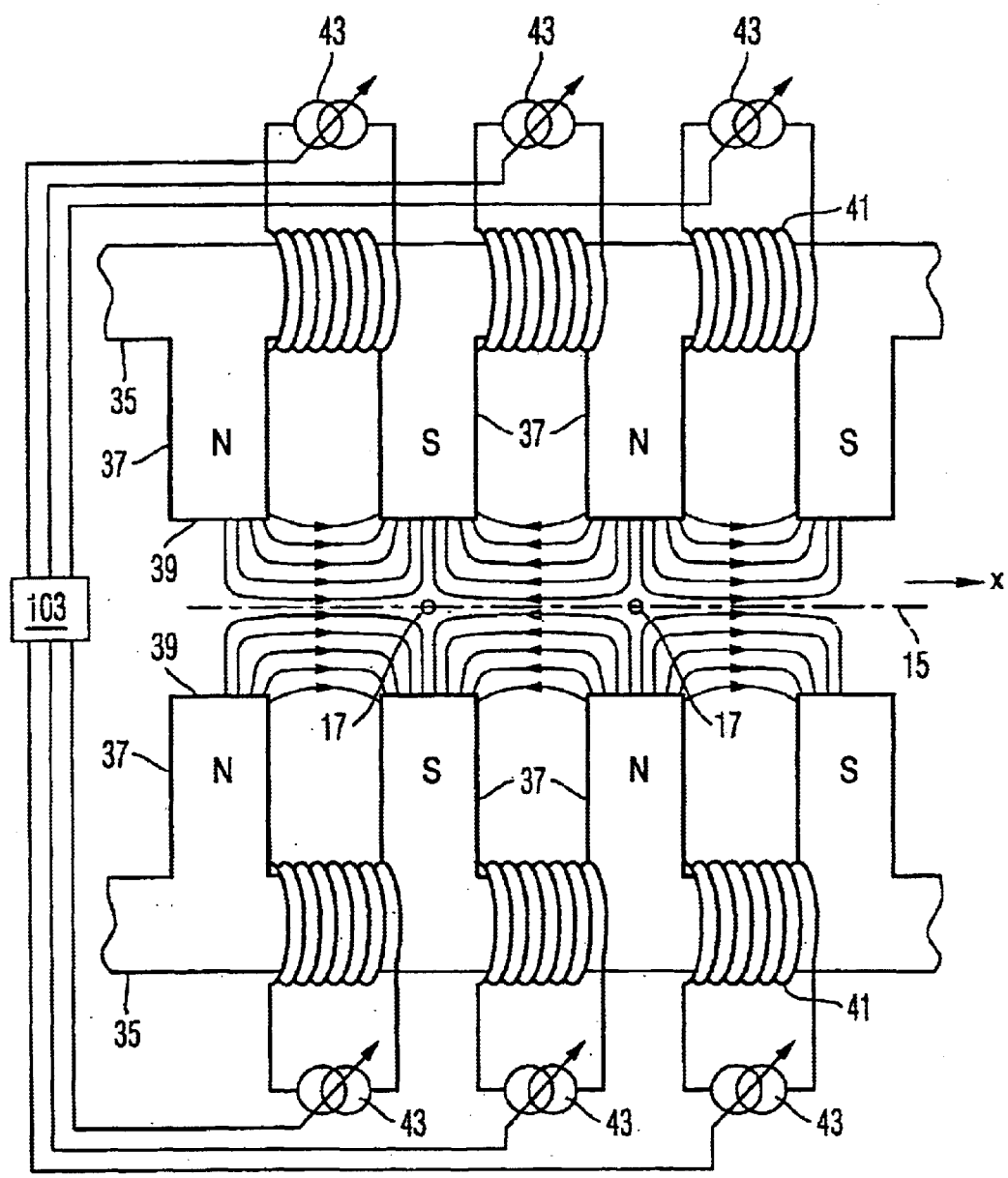
FIG. 9 is an illustration of a comb magnet assembly.

Alternatively, it is also possible to provide magnetic fields in an aperture of a lens assembly for manipulating the particle beam. An embodiment of such lens assembly is schematically shown in FIG. 9. The lens assembly 153 shown there comprises a plate 35 from which two rows of fingers 37 project towards the central axis 15 into the aperture. The fingers 37 are disposed spaced apart from each other and each one of said fingers comprises a front face 39 oriented towards the central axis 15. Between two adjacent fingers 37, a winding or coil 41 of electrically conductive wire is provided. In order to supply electric current to each one of the windings, a current source 43 is provided for each winding. The current sources are controllable by a controller 103 in order to supply to each winding 41 an adjustable current. The windings 41 then generate magnetic fields which, among others, are carried by the plate 35 and the fingers 37. In FIG. 9, a current pattern is applied to the windings 41 such that adjacent windings 41 each generate magnetic fields of opposite orientations. As a result, a magnetic field configuration is generated in the aperture of the lens assembly 153 as it is schematically indicated in FIG. 9 by field lines 45. The field configuration is approximately that of a plurality of quadrupole fields disposed along the central axis 15 adjacent to each other with axes of symmetry 17 spaced apart from each other.

It is also possible to combine the magnetic and electric lens assemblies in one single assembly, in that, for example, the fingers 37 are metal-plated to provide electrodes to which adjustable electric potentials can be applied. It is then possible to superimpose electric and magnetic fields in the apertures between the two rows of fingers to manipulate beams of charged particles.

Figure 10:
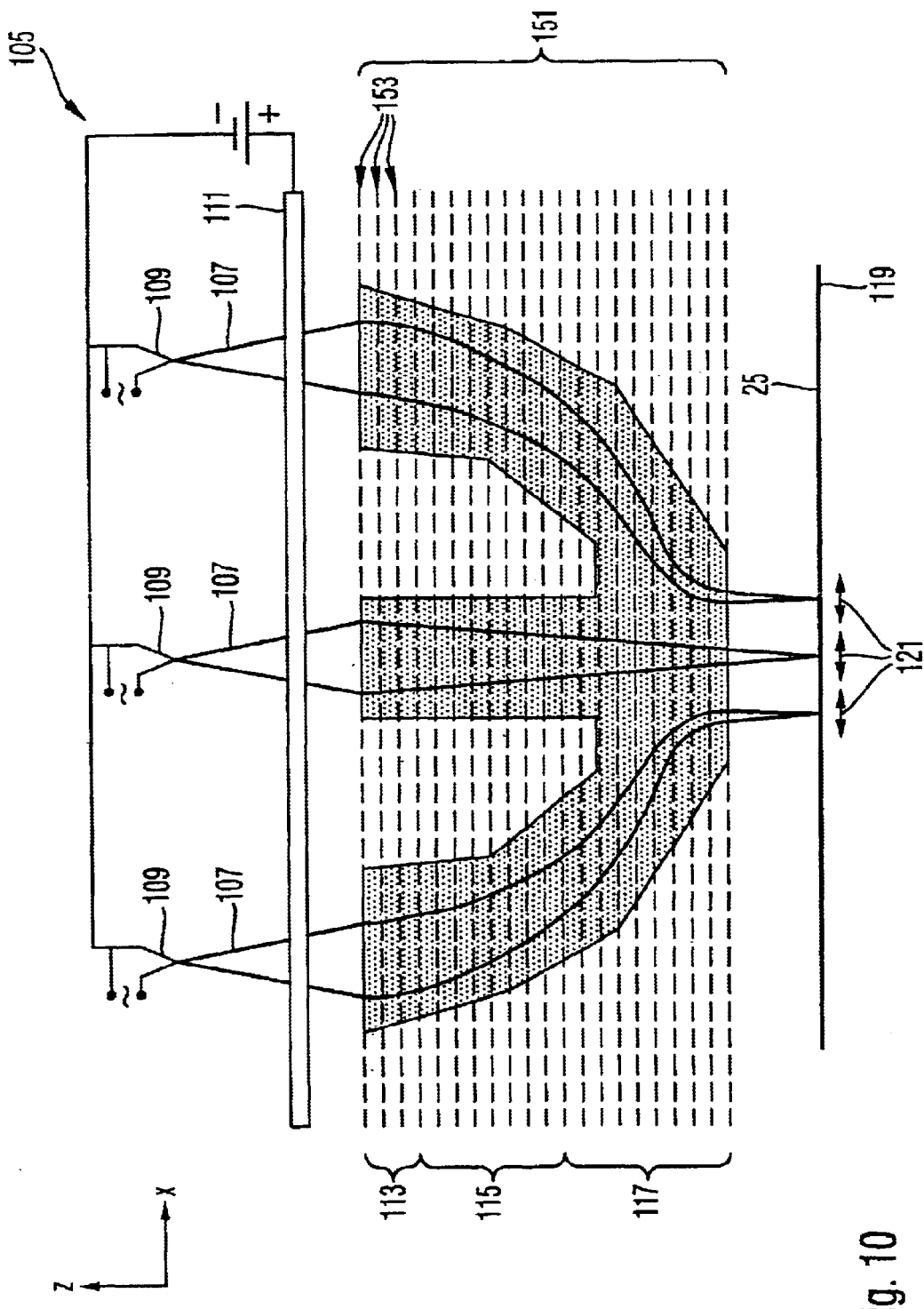
FIG. 10 illustrates an electron lithography system according to an embodiment of the invention.

FIG. 10 schematically shows an exemplary electron lithography system 105 which comprises a stack 151 of lens assemblies 153. The lithography system 105 operates with three electron beams 107 which are emitted from cathodes 109 which may be individually controlled for switching electron beams 107 on and off independently of each other. The emitted electrons are accelerated by an anode 111 which is biased relative to the cathodes 109. The electrodes then enter the stack 151, wherein the beams 107 travel at a distance from each other.

FIG. 10 shows the finger electrodes of the lens assembly 153 only schematically as short dashes. Those regions of finger electrodes in which a significant electric field for manipulating the electron beams 107 is provided are indicated by a dot pattern. In an upper region 113 in FIG. 10, a focusing effect is provided on the beams 107. In a region 115 downstream thereof, a substantially deflecting effect is provided on the left beam which is deflected to the left, and the right beam which is deflected to the right. The central beam is not deflected. In a region 117 further downstream, the beams are deflected in an opposite direction as compared to the region 115. The left beam 107 is deflected to the right and the right beam 107 is deflected to the left. The central beam 107 is again not deflected. As a result, the beams 107 are guided closer to each other than it corresponds to a distance of the cathodes 109. The three beams 107 emerge at the bottom from the stack 151 and impinge on a surface 25 of a semiconductor wafer 119 coated with a particle-sensitive layer or resist. The beams are finely focused on the surface to allow for a necessary resolution for writing a pattern onto the wafer and resist, respectively.

The voltage patterns required for providing such deflecting and focussing fields are supplied to the finger electrodes of the individual assemblies 153 by a controller, not shown in FIG. 10. The controller changes the patterns such that the positions at which the beams 107 are focused on the wafer surface 25 are displaceable in the x-direction, as it is intimated in FIG. 10 by arrows 121. The controller further controls the cathodes 109 for switching the beams 107 on and off. By switching the beams off and on and by simultaneously scanning the beams 107 across the object in the x-direction and continuously moving the object in the y-direction relative to the lens assembly, it is possible to write a pattern stored in the controller on the object surface 119, or to transfer it to the same.

As is evident from FIG. 10, the deflection of the beams 107 can be performed in wide curves so that only relatively minor "bends" are caused in the beam path by each lens assembly 153. As a result, it is possible to focus the beams in the object plane 119 with only relatively little aberrations. In conventional particle optics focusing has to be performed by a relatively low number of lenses, resulting in larger "bends" per lens. Larger bends are indicative of increased lens errors.

Moreover, the arrangement of the lens assemblies as a stack allows the beams to approach at first from a large distance when entering the top of the stack to a smaller distance when emerging from the stack.

The manufacture of the individual lens assemblies by use of a lithographic technique enables to manufacture rows of finger electrodes with the necessary precision, on the one hand, and with a limited expenditure in work, on the other hand. However, the use of lithographic techniques which include etching steps is limited to relatively thin substrates so that there are limits as far as the extension of the individual finger electrodes in the z-direction is concerned. A certain extension of the finger electrodes in the z-direction is, however, necessary in order to provide for the beams also a deflection field which is sufficiently extended in the z-direction. The limitation of the finger electrodes to infinitely thin plates is mostly not sufficient. However, the limitation of the individual finger electrodes in the z-direction does not constitute a serious problem, since this can be compensated for in that a higher number of thin lens assemblies 153, which are readily manufactured in a lithographic process, are stacked upon each other to provide a sufficient extension of a region occupied with finger electrodes in the z-direction.

Figure 11:
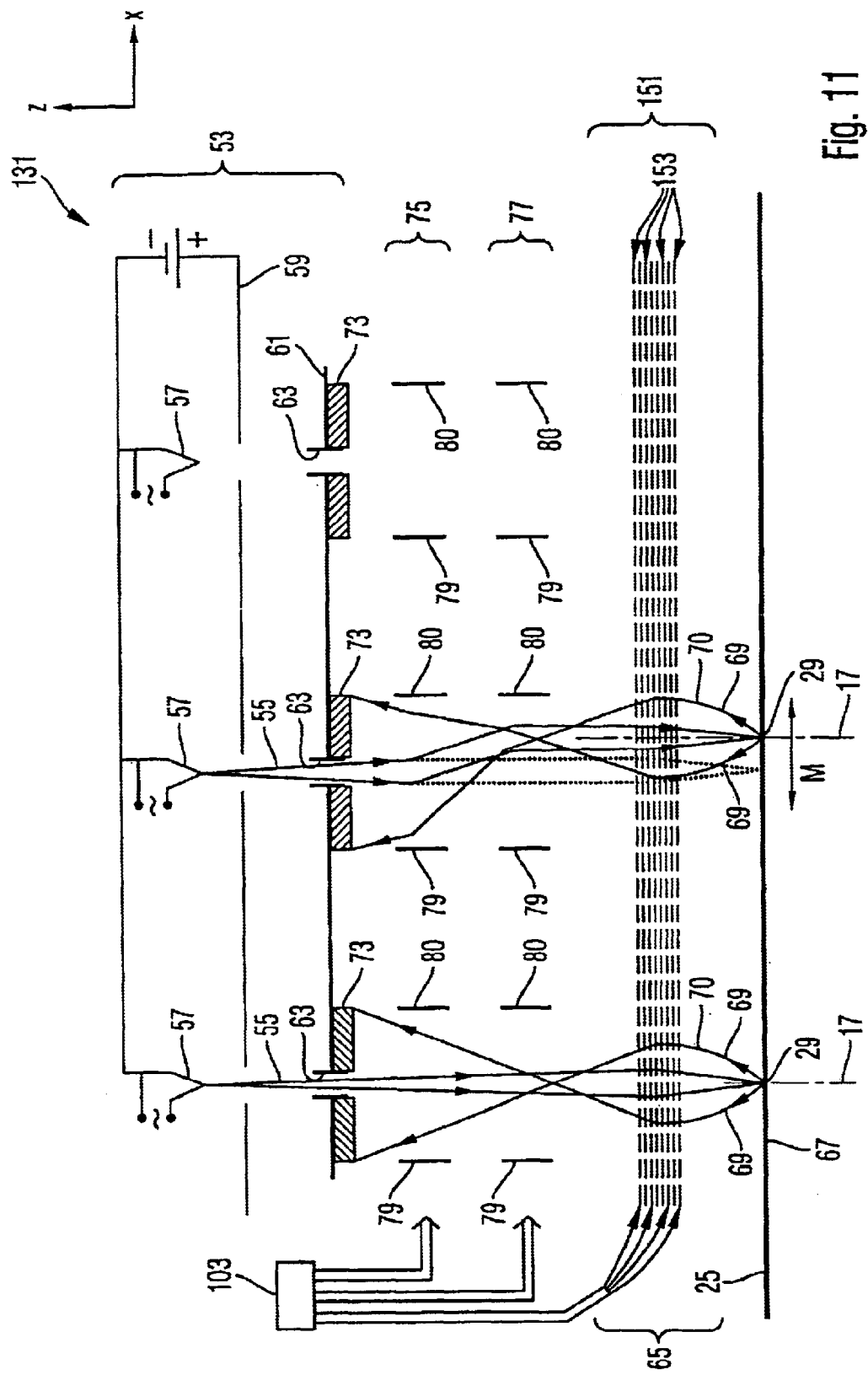
FIG. 11 illustrates an electron microscopy system according to an embodiment of the invention.

FIG. 11 schematically shows an exemplary scanning electron microscopy apparatus 131. It comprises a radiation source arrangement 53 for generating a plurality of primary electron beams 55 with a plurality of glow cathodes 57 for emitting electrons, an anode 59 for extracting the electrons from the cathodes 57 as well as an aperture stop 61 having a plurality of apertures 63 formed therein for shaping the plurality of beams 55. In FIG. 11, an arrangement 51 for providing three electron beams 55 is depicted. However, it is possible to correspondingly provide only two or more than three beams.

The microscopy apparatus 131 further comprises a stack 151 of lens assemblies 153 having a function of an objective lens 65 for focusing the primary electron beams 55 in an object plane 25 in which an object 67 to be inspected, such as a semiconductor wafer 67, is disposed. The primary electron beam 55 (probe beam) focused onto the object 67 releases secondary electrons. Trajectories of the secondary electrons are shown in FIG. 11 by some exemplary lines 69. The secondary electrons are accelerated by a suitable electric field applied between the objective 65 and the object 67, and they form secondary electron beams 70 which traverse the objective lens 151 and impinge on detectors 73 disposed below the aperture stop 61.

Between the detectors 73 and the objective 65, a first deflecting arrangement 75 and a second deflecting arrangement 77 are successively provided in the primary electron beams 55. The deflecting arrangements 75 and 77 comprise for each primary electron beam 55 a pair of deflecting electrodes 79 and 80 to which electric potentials are supplied by a controller 103 for generating an electric field between the electrode pair 79, 80 for deflecting the primary electron beam 55 passing therethrough. In case of the beam 55 shown on the left-hand side of FIG. 11, no voltage is applied to the electrodes 79, 80 of the two deflecting arrangements 75 and 77 so that the deflecting arrangements 75 and 77 are straightly traversed by the left primary electrode beam 55.

In case of the primary electron beam 55 shown in the center of FIG. 11, an electric voltage is applied to the electrodes 79, 80 of the upper deflecting arrangement 75 such that the primary electron beam 55 is first deflected by an angle to the right. An opposite voltage is applied to the electrodes 79, 80 of the lower deflecting arrangement 77 such that the primary electron beam 55 is deflected by a corresponding angle to the left, such that, after having traversed the deflecting arrangement 77, the beam extends again parallel to the z-axis in the direction of the objective arrangement 65. Accordingly, the two deflecting arrangements 75, 77 cause a parallel displacement in the object plane of the primary electron beam 55 focused in the object plane 25 so that the object 67 can be scanned with the probe beams.

The controller 103 now displaces the voltage patterns applied to the finger electrodes of the objective arrangement 65 in the x-direction together with the control of the deflecting electrodes 79, 80 of the deflecting arrangements 75, 77 to ensure, independent of the magnitude of the beam displacement M produced by the deflecting arrangements 75, 77, a substantially central impingement of the respective primary electron beam 55 in the quadrupole fields of the comb electrode 11 allocated to the same so that the focusing in the object plane 25 explained with reference to FIG. 3 is substantially ensured.

Accordingly, the microscopy apparatus 131 shown in FIG. 11 allows scanning an object simultaneously with a plurality of primary electron beams 55 and detecting for each one of the primary electron beams 55 a secondary electron signal allocated thereto by means of the detectors 73 provided for the respective beams. As a result, an electron-microscopic image of the object can be obtained.

Figure 12:
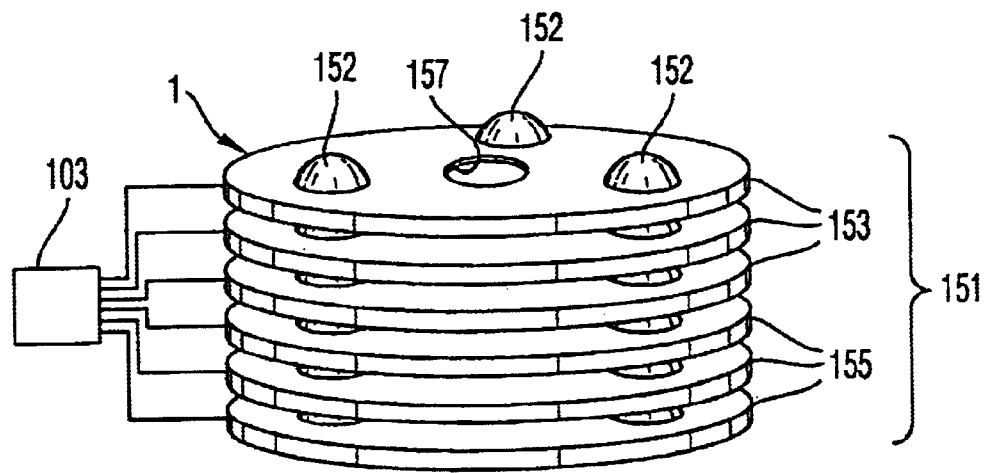
FIG. 12 is a perspective representation of a particle-optical apparatus having a stack of aperture electrode assemblies, according to a further embodiment of the invention.

FIG. 12 shows in perspective view an exemplary particle-optical apparatus 1 which comprises a stack 151 of lens assemblies 153. Each lens assembly 153 comprises a circular metal disc or plate 155 with a central circular aperture 157. Three spherical caps 152 of a sapphire material are mounted on each disc which maintain the discs 155 and thus the assemblies 153 at defined distances from each other and to also electrically insulate the same from each other.

Each one of the discs 155 is separately connected electrically to a controller 103. The controller 103 supplies adjustable and variable voltages to the discs 155.

Figures 13, 15:
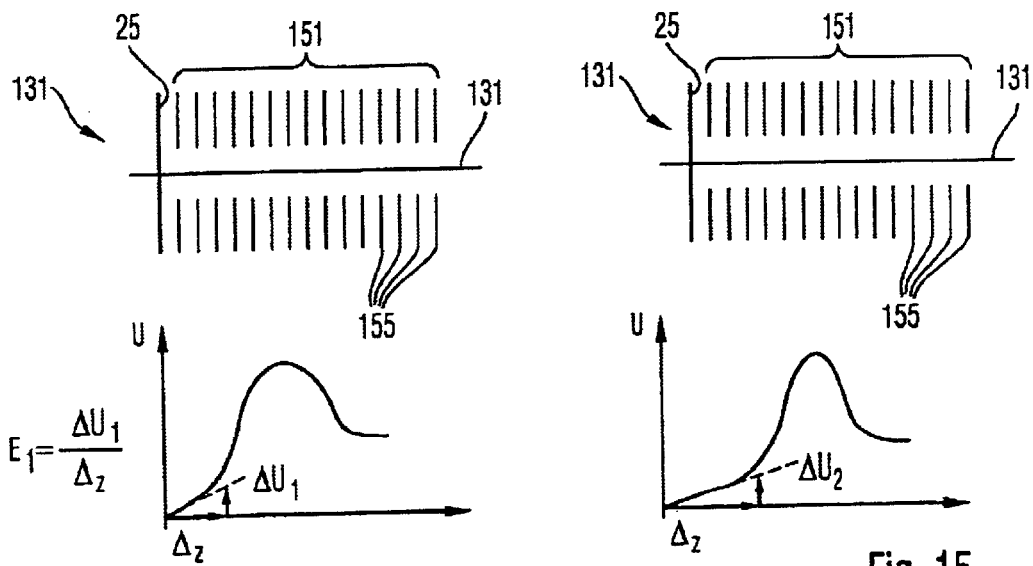
FIG. 13 illustrates a first mode of operation of the apparatus shown in FIG. 12.
FIG. 15 illustrates a second mode of operation of the apparatus shown in FIG. 12.

In the illustration in the upper part of the FIG. 13, the stack 151 forms an objective lens of an electron microscope 131 whose beam path is schematically shown in FIG. 14.

A voltage pattern is applied by the controller 103 to the lens assemblies 153, each of which defines a round lens for the electron beam, such that a potential configuration is formed on a central axis 131 of the stack 51 as it is shown in the lower part of FIG. 13. Between the object positioned in the object plane 25 and the aperture plate 155 next thereto, which is positioned spaced apart from the object plane at a distance $\Delta z$, there is a potential difference $\Delta U_1$ such that an electric extraction field $E_1$ is generated between the object and the aperture plate 155 next thereto which accelerates secondary electrons emanating from the object plane 25 towards the objective lens of the microscope 131 formed by the stack 151. This extraction field $E_1$ is represented at the bottom of FIG. 13 by a dashed line.

FIG. 14 does not show the stack 151 in detail. However, FIG. 14 shows, as a replacement, a geometry of the lens in the form of hatched blocks which would have the same effect on the electrons as the lens stack 151 when being operated in the first operating mode. The stack could be replaced by such a replacement lens in the first operating mode to have the same focusing effect on the electrons.

Moreover, FIG. 14 shows two angular beams in full line which start from the object plane 25 on the axis 131 and at an angle thereto. A field beam starting from the object plane 25 at a distance from the axis 131 and parallel thereto is shown in FIG. 14 in dashed line.

The focusing effect of the objective lens 151 is such that, a cross-over is formed downstream of the objective lens 151 in a plane 135. A further field lens 137 focuses the beam such that an intermediate image of the object plane 25 is generated in an intermediate image plane 139. A projective lens 141 finally images the intermediate plane 139 onto an image plane 143 in which a position-sensitive detector 145 is disposed. As a result, an image of the object plane 25 is generated on the detector 145.

FIG. 15 and FIG. 16 corresponding to the latter, illustrate a further exemplary operating mode of the electron microscope 131 which is different from the exemplary operating mode shown in FIGS. 13 and 14. In the second operating mode, a voltage $\Delta U_2$ between the aperture stop 155 next to the object plane 25 and the object is lower so that an extraction field $E_2$ acting on the electrons emerging from the object plane 25 is likewise weaker than the extraction field $E_1$ in FIG. 13. The extraction field $E_2$ which is weaker as compared to FIG. 13 is evident from the lower slope of the dashed straight line in FIG. 15.

If, in this second operating mode, the lens stack 151 were excited with a same voltage pattern as in the first operating mode, this would result in that a corresponding cross-over and the intermediate image would no longer be generated in the planes 135 and 139, respectively, of FIG. 14. The image of the object plane 25 would be blurred in the plane of the detector 145, and the field lens 137 and 144 would have to be controlled to set the image on the detector sharp again. However, the degrees of freedom for controlling the field lens 137 and the projective 141 are not fully sufficient for this purpose. However, in the second operating mode the objective lens 151 is supplied by the controller with a voltage pattern which is different from the voltage pattern in the first operating mode.

In FIG. 16, again, hatched blocks illustrate a geometry of a replacement lens of three electrodes which are dimensioned and positioned such that the replacement lens would have the same effect on the electrons as the lens stack 151 operated in the second operating mode.

Moreover, the resulting potential configuration on the axis 131 is shown in the lower part of FIG. 15. The control of the individual aperture electrodes 155 is in the second operating mode such that the cross-over downstream of the objective 151 again occurs in the same plane 135 as it is the case in the first operating mode. With the excitation of the field lenses 137 being substantially the same, the intermediate image is then also formed again in the same plane 139 as in the first operating mode. As a result, in the second operating mode, too, a substantially sharp image of the object plane 25 is formed again on the detector 145, without the excitation of the projective 141 having to be substantially changed.

It follows from a comparison of FIGS. 14 and 16, that two basically different geometries of lenses of three electrodes would be necessary to obtain in both operating modes an optimal image.

However, the plurality of aperture electrodes 155 of the stack 151 or objective lens provide sufficient degrees of freedom to optimize the objective for both operating modes in respect of an imaging quality. This follows also from the following consideration.

In both operating modes, the distance $\Delta z$ between the object plane 25 and the aperture stop 155 next thereto is equal. As the electrons have a higher kinetic energy when entering the stack in the first operating mode, the weight of the lens effect is also shifted closer to the object plane as compared to the second operating mode. This is evident from a comparison of the excitation patterns shown in FIGS. 14 and 16 and of the graphs in the lower parts of FIGS. 13 and 15, respectively. As a result, an electric field which is formed in the interior of the stack by the aperture plates 155 will also penetrate through the aperture 157 of the aperture plate 155 next to the object plane 25 and will reach to the object plane 25. The penetrating field is sufficiently inhomogeneous in the object plane and, therefore, has likewise a focusing effect on the secondary electrons emerging therefrom. This is evident from the curvature of the dashed line in FIG. 14. The curvature is provided shortly downstream of the object plane 25.

In the second operating mode, this effect is of not much importance since the first energized aperture plate 155 next to the object plane 25 is disposed at a larger distance from the object plane 25 than in the first operating mode. Accordingly, an electric field generated by the first aperture plate 155 penetrates to a considerably lesser degree to the object plane and through the aperture plate next to the object plane 25. Such penetrating field has a substantially negligible focusing effect on the secondary electrons in a region close to the object plane. This is evident from the substantially straight path of the dashed line to the interior of the disc stack 51.

This shows that, in order to generate an optimal image of the object plane 25 on the detector 145, the aperture plates 155 of the stack 151 must be differently excited in the two operating modes. To this end, the structure of the objective lens as lens stack 51, however, provides sufficient degrees of freedom.

Shifting the main lens effect closer to and further away from the object plane 25, respectively, can also be considered as a change in the working distance of the lens from the object, without the distance between the objective lens or the stack 151 and the object plane 25 having to be mechanically changed.

For a simplified operation of the lens stack the controller comprises a memory in which predefined voltage patterns can be stored in dependence on a predefined number of voltages at the sample, and when a desired voltage has to be applied to the sample, the corresponding voltage pattern is readily available from the memory. The voltage patterns stored in the memory may be calculated in advance and/or derived from experiments.

Figure 17:
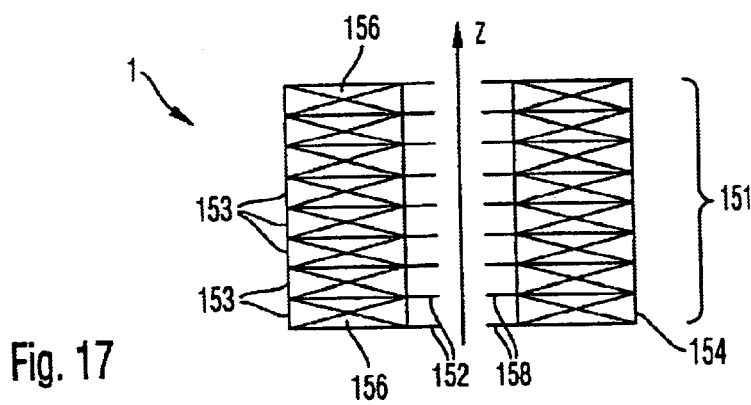
FIG. 17 illustrates a particle-optical apparatus having a stack of comb magnet assemblies.

FIG. 17 shows a variant of the lens assembly stack according to FIG. 12. In FIG. 12, the individual lens assemblies each provide an electrostatic lens. The particle-optical apparatus 1 shown in FIG. 17, however, comprises a stack 151 of a plurality of lens assemblies 153, each of which comprises a pair of circular planar pole pieces 152 which are magnetically closed radially outside by a cylindrical yoke 154. Between each pair of pole pieces 152, a current conductor winding 156 is provided which is supplied by an adjustable current source, not shown in FIG. 17, to generate adjustable magnetic fields between adjacent pole pieces 152. The focusing effects of these fields are successively applied on a beam of charged particles when passing through the stack 151 along an axis of symmetry z through aperture openings 158 of the pole pieces 152.

This stack of magnetically acting lens assemblies can be used in an electron microscope according to FIGS. 14 and 16 as an alternative to the electrostatic lens stacks.

The electron microscopy system 131 whose beam path is shown in FIGS. 14 and 16 images the object plane 25 two-dimensionally in position-preserving manner on the detector 145. Accordingly, the system can, for example, be used in a transmission electron microscope (TEM) in which the object is illuminated from a side opposite to the stack 151 in respect of the object plane 25. However, it is also possible to feed a primary electron beam into the beam path shown in FIGS. 14 and 16 by means of a beam splitter so that the illumination of the object plane 25 through the objective 151 with primary electrons is effected through the objective lens 151, such as in microscopes of a LEEM-type or a SEEM-type. It is also possible to illuminate the object plane 25 with a photon beam to release photo electrons from the object. The photon beam can be fed into the objective 151, for example, by a mirror.

Figure 18:
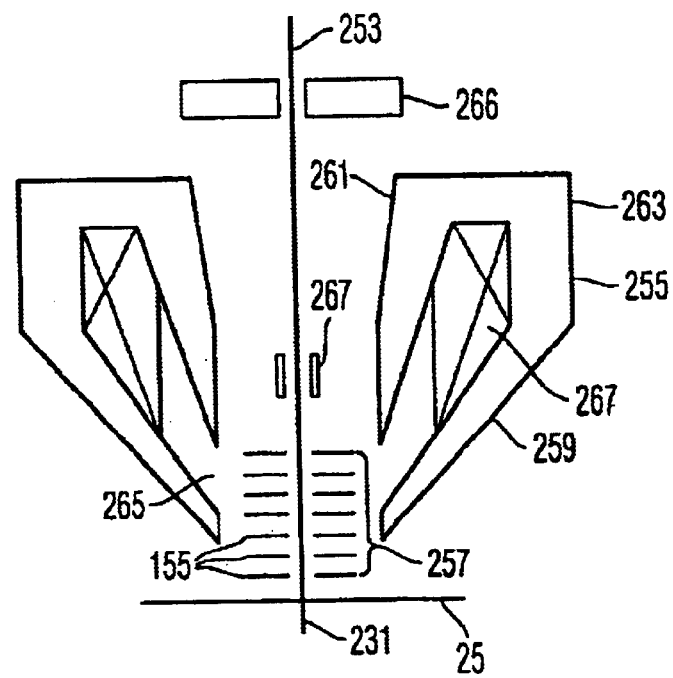
FIG. 18 is a sectional view of an object lens having a stack of lens assemblies.

FIG. 18 schematically shows an exemplary objective lens 251 of a scanning electron microscope (SEM), wherein in FIG. 18 a primary electron beam 253 is directed from above to the objective lens 251 along an optical axis 231 of the objective 251. The beam 253 is focused, on the one hand, by the effect of a magnetic focusing lens 255 and, on the other hand, by the effect of an electrostatic focusing lens 257. The electrostatic focusing lens 257 has a structure as has already been illustrated with reference to FIG. 12. Equally, the plurality of aperture stops 155 of the electrostatic lens 257 are individually controllable by a controller, not shown in FIG. 18, to optimize the focusing effect.

Even if an axial displacement of the magnetic field at different excitations of the magnetic focusing lens 255 would not take place due to saturation effects or the like, the lens stack of the electric focusing lens 257 again provides degrees of freedom to adapt the objective 251 with a view to different operating modes wherein, for example, different focusing settings, working distances or extraction fields can be selected.

The magnetic focusing lens 255 comprises a conical outer pole piece 259 and a likewise conical inner pole piece 261 which are closed radially outside by a magnetic yoke 263. An axial gap 265 is formed radially inside between the inner and the outer pole pieces 261 and 259. Between the inner and outer pole pieces 261 and 259, a magnetic coil 267 is provided for exciting a magnetic flux in the pole pieces which emerges from the pole piece gap 265 and has a focusing effect on the primary electron beam 253.

The objective lens 251 can be operated in different operating modes which differ in a strength of the excitation of the magnetic lens 255. As a result, the magnetic lens effect is displaced along the optical axis 231 due to, among others, saturation effects in the pole pieces. This is, among others, due to the fact that certain regions of the pole pieces 259, 261 become magnetically saturated at stronger excitations.

Apart from a strength of the magnetic field its position thereof will change along the optical axis, and, accordingly, the focusing effect of the magnetic lens 255 will be changed.

Since the magnetic lens 255 and the electrostatic lens 257 cooperate to focus the electrons, the electrostatic lens 257 is controlled such that it compensates for the change in the magnetic focusing effect and thus the electrostatic 257 and the magnetic 255 focusing lenses cooperate to provide a constant lens effect irrespective of the excitation of the magnetic lens 255. Therefore, the objective lens 251 can be operated in both operating modes with a high and substantially constant resolution.

FIG. 18 further shows a secondary electron detector 266 above the magnetic focusing lens 255 which is centrally traversed by the primary electron beam 253. FIG. 18 further shows a beam deflector 267 for deflecting the primary electron beam in the object plane 25 for generating an electron-microscopic image of the object plane 25 by scanning the object plane 25 with the primary electron beam.

Figure 19:
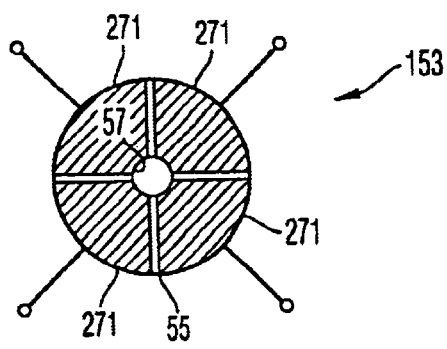
FIG. 19 illustrates a plan view of an aperture electrode assembly which can be used in one of the apparatuses shown in FIGS. 12 to 16 and 18.

FIG. 19 shows a variant of a lens assembly 153 which can be used in the stack 151 according to FIG. 12. The lens assembly 153 of FIG. 19 comprises an insulating circular supporting plate 155 with a central aperture 157. Four sector electrodes 271 are provided on the electrically insulating plate 155 which are insulated from each other and to which voltages can be applied independently of each other by a controller. As a result, the lens assembly 153 of FIG. 19, when being inserted into the stack according to FIG. 12, can be operated as quadrupole lens and can effect corrections at the electron beam passing through the stack.

If two electrodes 271 are supplied with a common voltage, the arrangement likewise acts as a beam deflector and can replace the beam deflector 267 of FIG. 18, if required.

It is also possible to provide, instead of the four sector electrodes 171, a higher number of sector electrodes to generate fields with hexapole symmetry or higher.

In summary, a particle-optical apparatus is provided to direct a beam of charged particles to an object plane or to image the object plane with the beam onto an image plane or intermediate image plane. The apparatus comprises a stack of lens assemblies which are disposed in beam direction at a fixed distances from each other and are controllable to provide successively adjustable deflection fields for a beam traversing the stack.

Each lens assembly provides at least one field source member for a magnetic or electric field. In particular, two rows of a plurality of field source members per lens assembly can be provided.

The present invention has been described by way of exemplary embodiments to which it is not limited. Variations and modifications will occur to those skilled in the art without departing from the scope of the present invention as recited in the appended claims and equivalents thereof.

What is claimed is:

1. A particle-optical apparatus for manipulating at least one beam of charged particles, the apparatus comprising:
   a stack of plural lens assemblies, the lens assemblies being disposed spaced apart from each other in a direction of the beam traversing the stack, wherein each lens assembly comprises at least one row of field source members for generating at least one of an electric field and a magnetic field for manipulating the beam, the row extending in a second direction tranversely oriented with respect to the first direction; and
   a controller adapted for applying a selectable excitation pattern to the at least one row of field source members of each lens assembly, wherein a first excitation pattern applied to the at least one row of field source members of a first lens assembly is different from a second excitation pattern applied to the at least one row of field source members of a second lens assembly different from the first lens assembly.

2. The particle-optical apparatus according to claim 1, wherein the lens assembly comprises two rows of field source members spaced apart from each other in a third direction orthogonal to the first and second directions.

3. The particle-optical apparatus according to claim 1, wherein the controller comprises plural drivers for energising the field source members of each row, wherein plural field source members are connected to each driver, and wherein each field source member is connected to one single driver, at a given time.

4. The particle-optical apparatus according to claim 1, wherein the field source members of one row project from a common plate.

5. The particle-optical apparatus according to claim 1, wherein the lens assemblies of the stack are spaced apart in the beam direction by less than 5 mm.

6. The particle-optical apparatus according to claim 1, wherein the assemblies of the stack are of a substantially same configuration.

7. The particle-optical apparatus according to claim 1, further comprising sources of plural beams of electrons directed to the stack for being manipulated thereby.

8. The particle-optical apparatus according to claim 7, wherein each of the plural sources is selectively switchable between a first state in which the beam is directed to the stack and a second state in which the beam is not directed to the stack.

9. The particle-optical apparatus according to claim 1, further comprising at least one secondary electron detector.

10. A method of operating a particle-optical apparatus, wherein the particle-optical apparatus provides a beam path for at least one beam of charged particles through at least one focusing lens and through at least one stack of at least four lens assemblies which are spaced apart in a direction of the beam path, wherein each of the lens assemblies comprises a plate oriented transversely to the beam direction and having at least one aperture formed therein and having at least one field source member for providing a beam manipulating field, the method comprising:

exciting the at least one focusing lens and exciting the at least four field source members of the lens assemblies of the at least one stack such that a first optical plane is imaged by the beam into a second optical plane which is optically conjugated to the first optical plane;

changing the excitation of the at least one focusing lens; and changing the excitation of the at least four lens assemblies such that positions of the first and second optical planes along the beam path are maintained substantially constant when changing the excitation of the at least one focusing lens.

11. The method according to claim 10, wherein the stack comprises a first lens assembly having a highest excitation among all lens assemblies of the stack before changing the excitation of the at least one focusing lens, and wherein a second lens assembly, which is different from the first lens assembly, has the highest excitation among all lens assemblies of the stack after changing the excitation of the at least one focusing lens.

12. A particle-optical apparatus providing a beam path for at least one beam of charged particles, the beam path having at least two optically conjugated planes, the apparatus comprising:

at least one focusing lens;

at least one stack of at least four lens assemblies which are spaced apart in a direction of the beam path, wherein each of the lens assemblies comprises a plate oriented transversely to the beam direction and having at least one aperture formed therein and having at least one field source member for providing a beam manipulating field; and a controller for exciting the at least one focusing lens and exciting the field source members of the lens assemblies of the stack, wherein the controller is adapted to change the excitation of the at least one focusing lens and to change the excitation of the field source members of the lens assemblies of the stack such that positions of the two optically conjugated planes along the beam path are maintained substantially constant when changing the excitation of the at least one focusing lens.

13. The particle-optical apparatus according to claim 12, wherein the controller comprises a memory for storing a plurality of excitation values of the at least one focusing lens, and, associated with each excitation value of the at least one focusing lens, corresponding excitation values of the field source members of the lens assemblies.

14. The particle-optical apparatus according to claim 12, wherein the at least one focusing lens comprises an objective lens, wherein the apparatus comprises a mount for carrying an object with a surface thereof facing the objective lens, and wherein the surface of the object substantially coincides with one of the at least two optically conjugated planes.

15. The particle-optical apparatus according to claim 14, wherein the objective lens generates a magnetic focusing field to the beam, and wherein the stack of lens assemblies generates an electric focusing field.

16. The particle-optical apparatus according to claim 14, wherein the objective lens generates a magnetic focusing field to the beam, and wherein the stack of lens assemblies generates an electric extraction field between the surface of the object and the stack.

17. The particle-optical apparatus according to claim 14, further comprising a primary electron source located substantially in one of the at least two conjugate planes.

18. The particle-optical apparatus according to claim 14, further comprising an electron detector located substantially in one of the at least two conjugate planes.

19. The particle-optical apparatus according to claim 14, further comprising a writing electron beam source for generating at least one writing beam.

20. The particle-optical apparatus according to claim 14, further comprising a beam deflector.

21. The particle-optical apparatus according to claim 12, wherein the assemblies of the stack are spaced apart in the beam direction by less than 5 mm.

* * * * *